(12) United States Patent
Lee

(10) Patent No.: US 12,408,510 B2
(45) Date of Patent: *Sep. 2, 2025

(54) LIGHT EXTRACTION SUBSTRATE OF ORGANIC LIGHT-EMITTING DEVICE AND METHOD OF MANUFACTURING THE SAME

(71) Applicant: CORNING INCORPORATED, Corning, NY (US)

(72) Inventor: JooYoung Lee, Anyang-si (KR)

(73) Assignee: CORNING INCORPORATED, Corning, NY (US)

( * ) Notice: Subject to any disclaimer, the term of this patent is extended or adjusted under 35 U.S.C. 154(b) by 453 days.

This patent is subject to a terminal disclaimer.

(21) Appl. No.: 18/082,834

(22) Filed: Dec. 16, 2022

(65) Prior Publication Data

US 2023/0118365 A1    Apr. 20, 2023

Related U.S. Application Data

(63) Continuation of application No. 17/054,349, filed as application No. PCT/US2019/032251 on May 14, 2019, now Pat. No. 11,653,526.

(30) Foreign Application Priority Data

May 15, 2018  (KR) .................. 10-2018-0055483

(51) Int. Cl.
  *H10K 50/854*   (2023.01)
  *H10K 71/00*   (2023.01)
(52) U.S. Cl.
  CPC ........... *H10K 50/854* (2023.02); *H10K 71/00* (2023.02)

(58) Field of Classification Search
  CPC ...... H10K 50/854; H10K 71/00; H10K 77/10; Y02E 10/549; Y02P 70/50
  See application file for complete search history.

(56) References Cited

U.S. PATENT DOCUMENTS 11,653,526 B2 *  5/2023  Lee .................. H10K 71/00
                                                    257/40
2007/0115550 A1   5/2007  Nakayama et al.
(Continued)

FOREIGN PATENT DOCUMENTS

CN    107210379 A    9/2017
EP    3249712 A1    11/2017
(Continued)

OTHER PUBLICATIONS

Chinese Patent Application No. 201980040607.3, Office Action dated Aug. 30, 2023, 4 pages (English Document only), Chinese Patent Office.
(Continued)

*Primary Examiner* — J.E. Schoenholtz

(57) ABSTRACT

Various aspects of an OLED and related methods of manufacturing are provided, wherein a light extraction substrate of an OLED includes a base substrate; a porous light-scattering layer, including a first material, and having a plurality of holes formed therein; a planarization layer formed on the light-scattering layer, and including a second material; and a plurality of scattering structures including the second material, and formed by the second material infiltrated from the planarization layer into the light-scattering layer to fill at least a part of the plurality of holes, the scattering structures including a plurality of second scattering structures.

12 Claims, 9 Drawing Sheets

(56) References Cited

U.S. PATENT DOCUMENTS

| | | | |
|---|---|---|---|
| 2014/0131675 A1 | 5/2014 | Chien et al. | |
| 2014/0234583 A1 | 8/2014 | Ryu et al. | |
| 2017/0107344 A1 | 4/2017 | Iwaya et al. | |
| 2017/0255309 A1 | 9/2017 | Park et al. | |
| 2017/0358776 A1* | 12/2017 | Youn | H10K 50/854 |
| 2017/0373280 A1* | 12/2017 | Lee | H10K 50/80 |

FOREIGN PATENT DOCUMENTS

| | | |
|---|---|---|
| JP | 2006-222028 A | 8/2006 |
| KR | 10-2016-0090252 A | 7/2016 |

OTHER PUBLICATIONS

International Search Report and Written Opinion of the International Searching Authority; PCT/US2019/032251; Mailed Jul. 25, 2019; 11 Pages; European Patent Office.

* cited by examiner

LIGHT EXTRACTION SUBSTRATE OF ORGANIC LIGHT-EMITTING DEVICE AND METHOD OF MANUFACTURING THE SAME

CROSS-REFERENCE TO RELATED APPLICATIONS

This application is a continuation of U.S. application Ser. No. 17/054,349 filed on Nov. 10, 2020, which claims the benefit of priority under 35 U.S.C. § 371 of International Application No. PCT/US2019/032251, filed on May 14, 2019, which is based upon and claims the benefit of priority from prior Korean patent application No. 10-2018-0055483 filed on May 15, 2018, the entire contents of which are incorporated herein by reference.

TECHNICAL FIELD

The present disclosure relates to a light extraction substrate of an organic light-emitting device and a method of manufacturing the same and, more specifically, to a light extraction substrate of an organic light-emitting device and a method of manufacturing the same capable of maximizing a light extraction efficiency.

BACKGROUND ART

An organic light-emitting device emits only about 20% of generated light due to inherent structural reasons. In order to overcome this ineffectiveness, researches on a light extraction layer are conducted so as to also extract and use 80% of the light, which otherwise is to be lost, from the organic light-emitting device.

The light extraction layer is largely divided into an internal light extraction layer and an external light extraction layer. The external light extraction layer can conveniently achieve the light extraction effect by attaching a film, which includes structures of diverse forms, to an outside of a base substrate. However, its light extraction efficiency is limitative, although it does not much depend on the forms of the structures. The internal light extraction layer extracts light which otherwise, is lost in an optical waveguide mode, and can provide a higher light extraction efficiency than the external light extraction layer.

SUMMARY OF INVENTION

Aspect of non-limiting embodiments of the present disclosure provides an internal light extraction layer capable of effectively extracting lost light.

Aspects of certain non-limiting embodiments of the present disclosure address the features discussed above and/or other features not described above. However, aspects of the non-limiting embodiments are not required to address the above features, and aspects of the non-limiting embodiments of the present disclosure may not address features described above.

According to a first aspect of the present disclosure, there is provided a light extraction substrate of an organic light-emitting device. The light extraction substrate includes a base substrate; a porous light-scattering layer formed on the base substrate, including a first material, and having a plurality of holes formed therein; a planarization layer formed on the light-scattering layer, and including a second material; and a plurality of scattering structures including the second material, and formed by the second material infiltrated from the planarization layer into the light-scattering layer to fill at least 5% of a total volume of the plurality of holes, wherein at least a part of the plurality of scattering structures has voids formed therein.

According to a second aspect of the present disclosure, there is provided a method of manufacturing a light extraction substrate of an organic light-emitting device. The method includes forming a light-scattering layer on a base substrate, the light-scattering layer including a first material and having a plurality of holes formed therein; forming a planarization layer on the light-scattering layer, the planarization layer including a second material, and forming a plurality of scattering structures by the second material infiltrated from the planarization layer into the light-scattering layer, wherein the plurality of scattering structures is formed by the second material filling at least 5% of a total volume of the plurality of holes, and wherein at least a part of the plurality of scattering structures has voids formed therein.

BRIEF DESCRIPTION OF DRAWINGS

Embodiment(s) of the present disclosure will be described in detail based on the following figures, wherein.

DESCRIPTION OF EMBODIMENTS

Hereinafter, the present disclosure will be described in detail with reference to the accompanying drawings.

Figure 1:
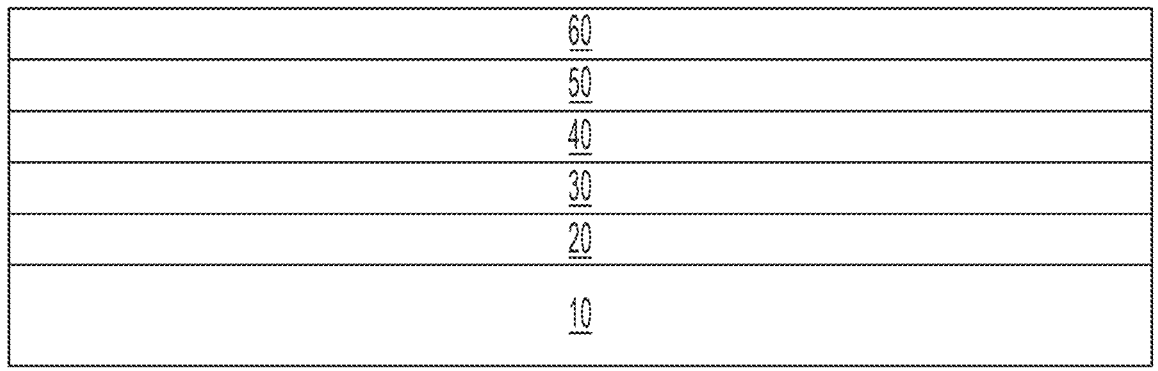
FIG. 1 is a cross-sectional view depicting a structure of an organic light-emitting device in accordance with an embodiment of the present disclosure.

FIG. 1 is a cross-sectional view depicting a structure of an organic light-emitting device in accordance with an embodiment of the present disclosure.

In an embodiment, as shown in FIG. 1, the organic light-emitting device may include a light extraction substrate and an organic light-emitting element formed on the light extraction substrate. In an embodiment, the light extraction substrate may include a base substrate 10, a light-scattering layer 20 formed on the base substrate 10, a planarization layer 30 formed on the light-scattering layer 20, and a plurality of scattering structures (not shown) dispersed in the light-scattering layer 20. In an embodiment, the organic light-emitting element may include electrode layers 40, 60 and an organic layer 50. In an embodiment, the organic layer 50 may include a light-emitting layer.

Figure 2:
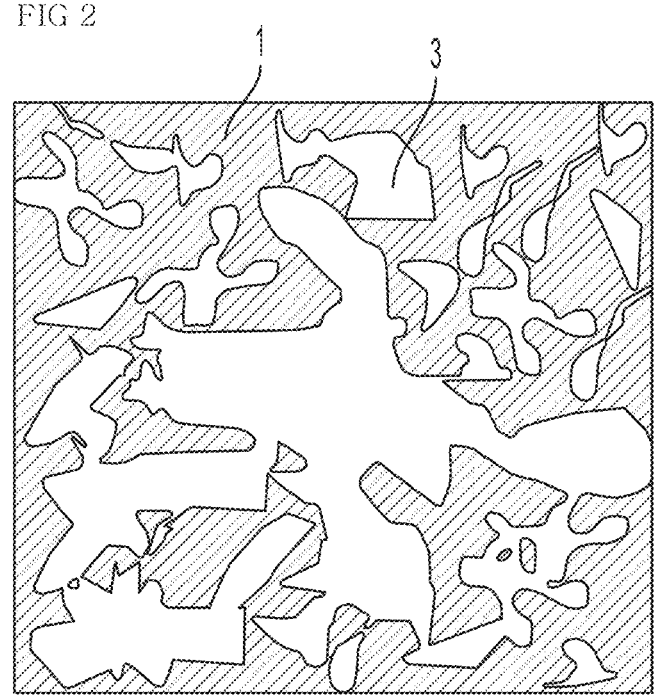
FIG. 2 illustrates a cross section of a light-scattering layer in Comparative Example 1.
Figure 3:
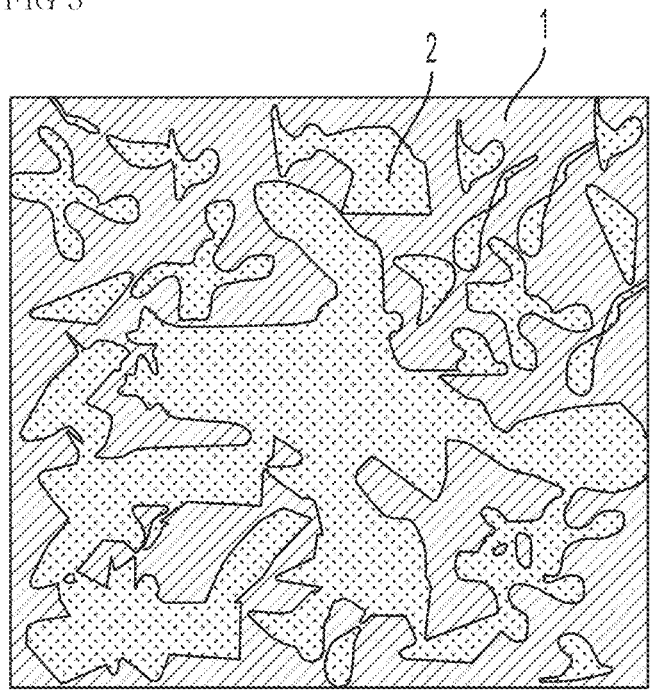
FIG. 3 illustrates a cross section of a light-scattering layer in Comparative Example 2.
Figure 4:
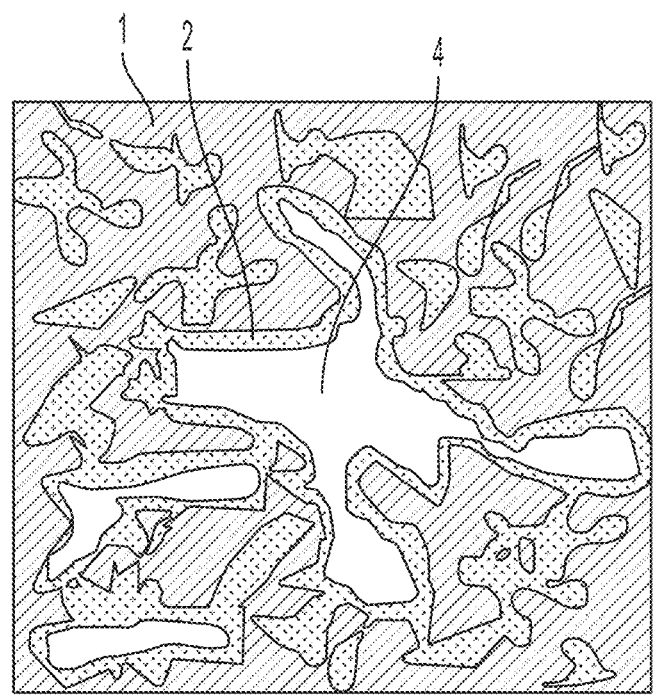
FIG. 4 illustrates a light-scattering layer in accordance with an embodiment of the present disclosure.

FIG. 2 illustrates a cross section of a light-scattering layer in Comparative Example 1, FIG. 3 illustrates a cross section of a light-scattering layer in Comparative Example 2, and FIG. 4 illustrates a light-scattering layer in accordance with an embodiment of the present disclosure.

The light-scattering layer can increase a light extraction efficiency by using a refractive index difference. In order to increase the light extraction efficiency, the light-scattering layer is required to meet following conditions, for example.

A refractive index of the light-scattering layer should be similar to or greater than that of an electrode layer.

The light should be effectively scattered in the light-scattering layer.

A light absorptivity of the light-scattering layer should not be high so that the scattered light can be extracted to the outside without being lost.

A surface of the light-scattering layer should be suitable for formation of the electrode layer thereon.

In an embodiment, the light-scattering layer may include a first material 1. The first material 1 may be a metal oxide. The metal oxide may be one or a combination of at least two or more selected from the group consisting of $SiO_2$, ZnO, $BaTiO_3$, $TiO_2$, $SnO_2$, $ZrO_2$ and $Al_2O_3$. In an embodiment, the metal oxide may be $TiO_2$ having a dendritic crystal habit. In an embodiment, the light-scattering layer may have a porous structure having a plurality of holes 3 formed therein.

When there are pores in the light-scattering layer, the refractive index difference is large, so that scattering power is increased. However, the surface roughness may highly deteriorate characteristics of a transparent electrode layer to be vapor deposited on the light-scattering layer. When a size of the pore is smaller than ¼ of a wavelength of extracted light, the extracted light tends to pass through the pore without recognizing the pore having the corresponding size. In this case, an effective refractive index of the light-scattering layer is lowered due to the pores, so that the light extraction function is inevitably lowered.

Therefore, the planarization layer is formed on the porous light-scattering layer, thereby making it possible to appropriately form an electrode layer on the surface thereof. In an embodiment, the planarization layer may include a second material 2. In an embodiment, the second material 2 may be an organic-inorganic hybrid material (hybrimer). The hybrimer may include silsesquioxane linked with the metal oxide (for example, MgO, $Al_2O_3$, $ZrO_2$, $SnO_2$, ZnO, $SiO_2$, $TiO_2$), polysiloxane, or a combination thereof.

In an embodiment, the scattering structures may be formed by the second material 2 infiltrated from the planarization layer into the light-scattering layer. The scattering structures may be formed by the second material 2 filling at least a part of the plurality of holes 3 formed in the light-scattering layer. In an embodiment, as shown in FIG. 4, the scattering structures may include first scattering structures consisting of the second material 2 (without voids 4) and second scattering structures having voids 4 formed in the second material 2. Therefore, in the embodiment, the first scattering structures and the second scattering structures may be mixed in the light-scattering layer. In the meantime, when the holes 3 are too small, the second material 2 cannot be infiltrated therein, so that the holes may remain empty without being filled with the second material 2.

After forming the light-scattering layer, which is a porous metal oxide layer, on the base substrate, the first scattering structures and the second scattering structures are formed in at least a part of the plurality of holes 3 in the light-scattering layer by using the second material 2, so that it is possible to cause the effective light scattering by using differences of refractive indexes of the first material 1, the second material 2 and the air, thereby maximizing the light extraction efficiency of the organic light-emitting device.

The refractive index of the first material 1 is denoted as n1 (n1>1), the refractive index of the second material 2 is denoted as n2 (n1>n2>1), and the refractive index of the air is denoted as 1.0. When a void ratio of any localized site of the light-scattering layer or a ratio of the second material filling the holes 3 is denoted as x (0<x<1), a range of effective refractive indexes of localized sites is schematically expressed as follows:

Comparative Example 1: $1<n<(1-x)*n1+x$ (maximum refractive index difference=$(1-x)*n1-(1-x)$)

Comparative Example 2: $n2<n<(1-x)*n1+x*n2$ (maximum refractive index difference=$(1-x)*n1-(1-x)*n2$)

Embodiment of the present disclosure: $1<n<(1-x)*n1+x*n2$ (maximum refractive index difference=$(1-x)*n1+x*n2-1$)

When comparing the maximum refractive index differences of the respective sites, it can be seen that the refractive index difference is greatest in the embodiment of the present disclosure and is smallest in Comparative Example 2. Therefore, it can be seen that the light scattering effect is greatest in the embodiment of the present disclosure, as compared to Comparative Examples.

In an embodiment, the refractive index of the second material 2 with respect to 633 nm light may be 1.6 or higher.

In an embodiment, a ratio of the voids 4 may range from 1% to 20% of an entire area of the light-scattering layer, based on a cross-sectional area.

In an embodiment, on a cross-section of the light-scattering layer, a ratio of voids having a longest-to-shortest length ratio of 1.5 times or greater may be 50% or greater of the total voids 4.

Figure 5:
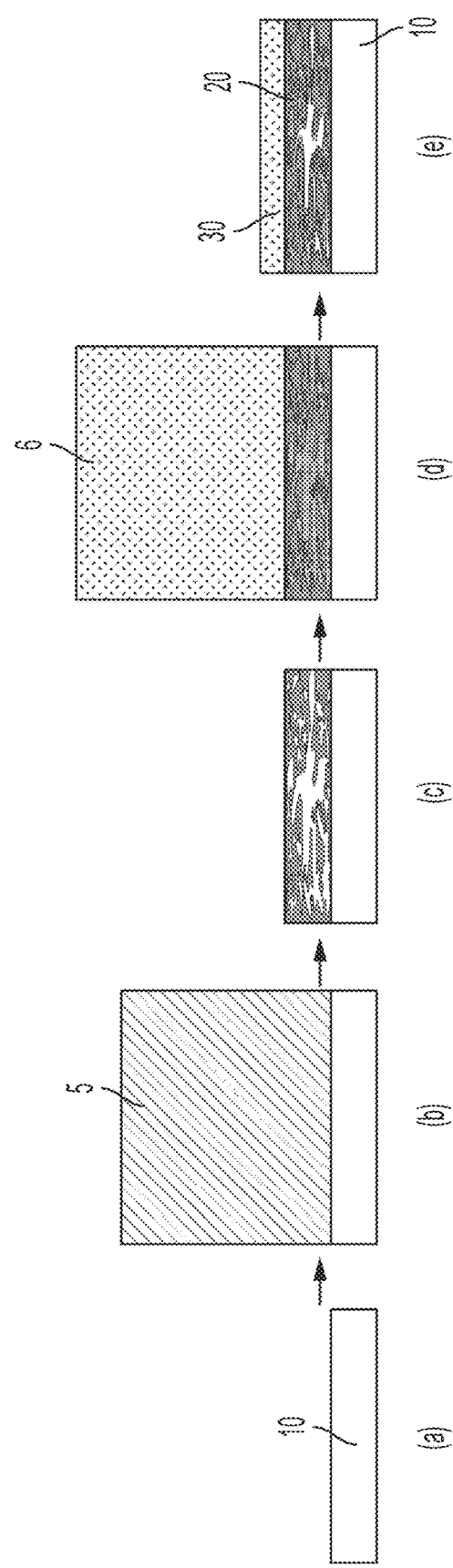
FIG. 5 schematically depicts a method of manufacturing a light extraction substrate of an organic light-emitting device in accordance with an embodiment of the present disclosure.

FIG. 5 schematically depicts a method of manufacturing a light extraction substrate of an organic light-emitting device in accordance with an embodiment of the present disclosure.

When a first coating solution 5, which includes the first material 1 and a solvent, is applied and dried on the base substrate 10 (refer to (b) in FIG. 5), the solvent is evaporated, so that the porous light-scattering layer 20 having the plurality of holes 3 formed therein is formed (refer to (c) in FIG. 5). In an embodiment, the plurality of holes 3 may have the void ratio of 50% or greater. Then, when a second coating solution 6, which includes the second material 2 and a solvent, is applied on the light-scattering layer 20, at least some holes of the plurality of holes 3 are immersed in the second coating solution 6 (refer to (d) in FIG. 5). Then, when a heat treatment is performed, the solvent of the second coating solution 6 is evaporated. In particular, the solvent of the second coating solution 6 filled in holes, which have relatively large sizes, of the holes 3 in the light-scattering layer 20 is evaporated, so that the second material 2 is coated on inner surfaces of the holes and the voids 4 may be re-formed therein (refer to (e) in FIG. 5). In an embodiment, 5% or more of a total volume of the plurality of holes 3 may be filled with the second material 2. In an embodiment, 5% to 65% of the total volume of the plurality of holes 3 may be filled with the second material 2. Also, the dried second material 2 forms the planarization layer 30 on the surface of the light-scattering layer, thereby performing planarization and protective function.

Figure 6:
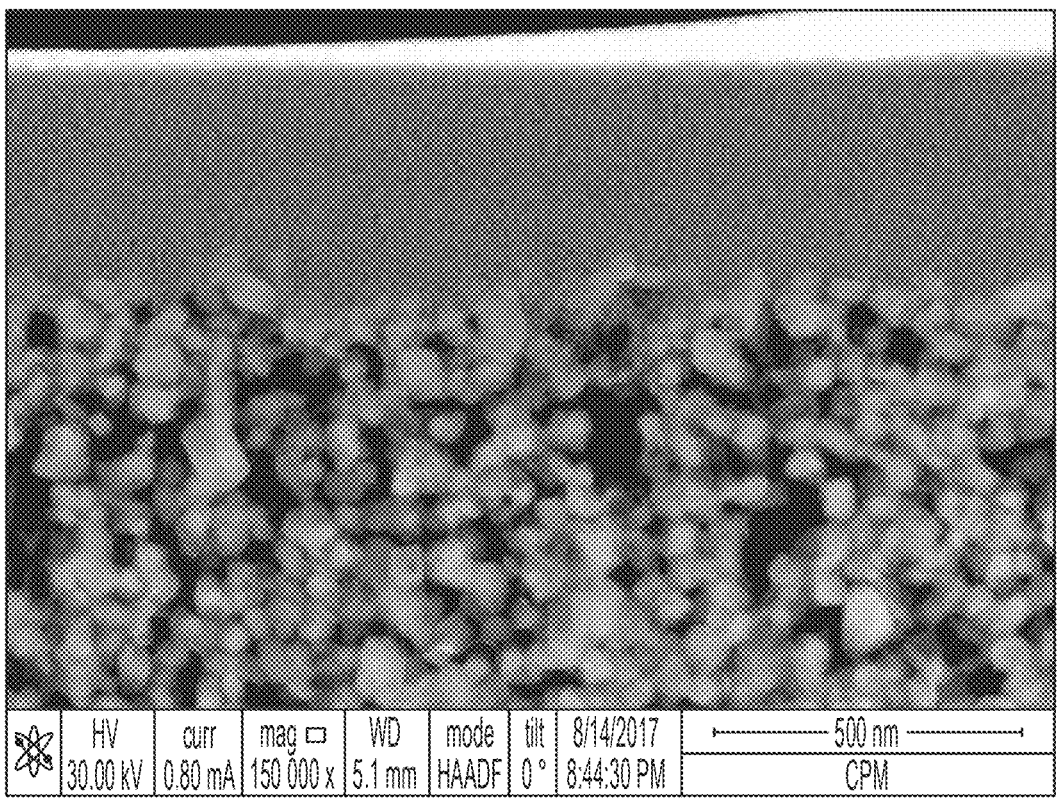
FIG. 6 is a cross-sectional image of a light-scattering layer in accordance with an embodiment of the present disclosure.
Figure 7:
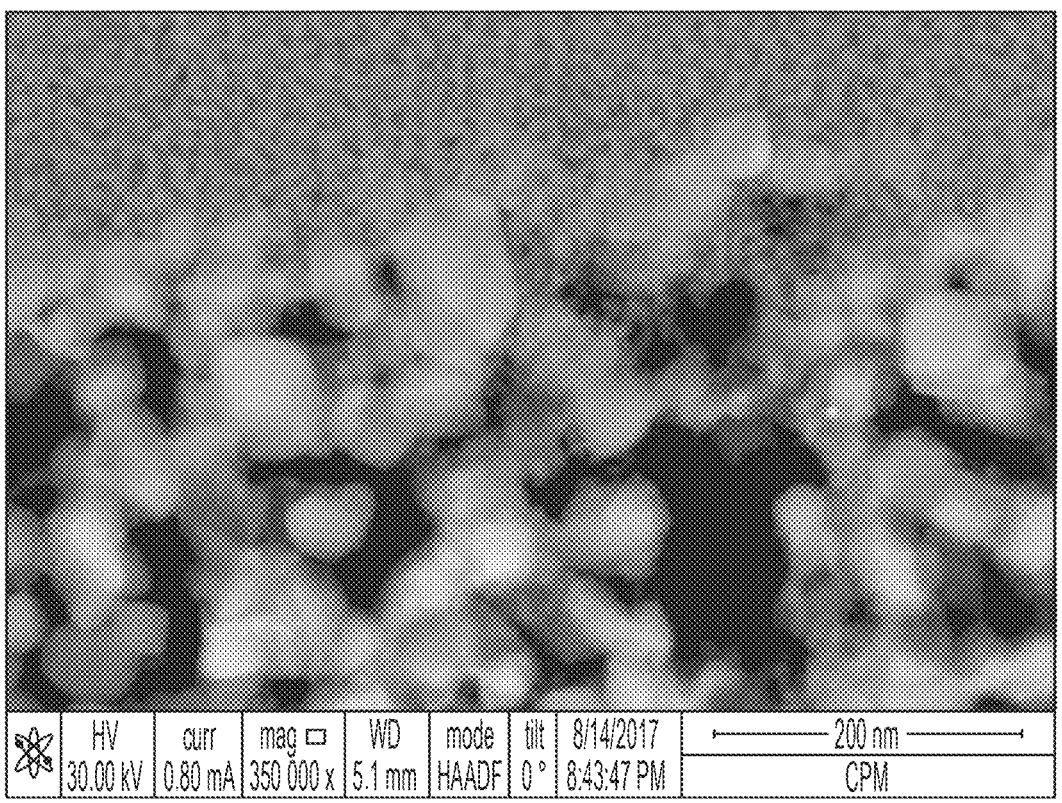
FIG. 7 is a partially enlarged image of FIG. 6.

FIG. 6 is a cross-sectional image of the light-scattering layer, and FIG. 7 is a partially enlarged image of FIG. 6.

In order to check a cross-section of a prepared sample, a transmission electron microscopy (TEM) specimen was prepared and observed to obtain images of FIGS. 6 and 7. In FIGS. 6 and 7, black portions indicate the pores.

Figure 8:
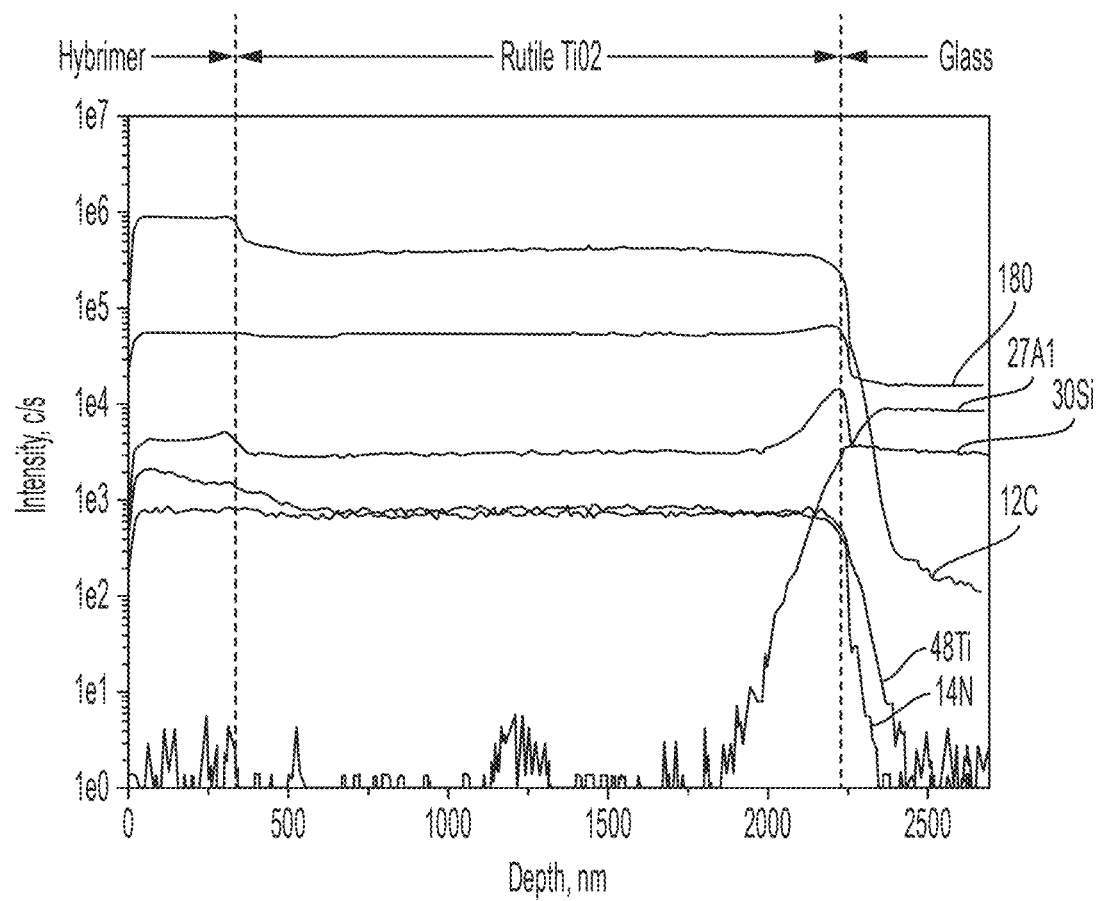
FIG. 8 shows a SIMS analysis result on the light-scattering layer of FIG. 6.

FIG. 8 shows a secondary ion mass spectroscopy (SIMS) analysis result on the light-scattering layer.

The SIMS analysis was performed to obtain a result shown in FIG. 8. In the SIMS analysis, IMS 4FE7 (available from Cameca Company) was used, and a Cs+ ion gun was used. Seeing the distributions of Si and C, which are elements of the second material, from the depth profile, it can be seen that the second material fills some of the holes in the light-scattering layer and the ratios of the elements are substantially constant, irrespective of the depth from the surface of the light-scattering layer. This shows that the second material is uniformly distributed in the holes of the light-scattering layer. Also, this means that the voids formed in the light-scattering layer are substantially uniformly distributed from the upper layer part to the lower layer part. The result of FIG. 8 is just exemplary, and the absolute intensities (intensities of signals) between the elements may have a slight deviation, and the present disclosure is not limited the analysis graph of FIG. 8.

When the light-scattering layer is divided into a first surface region, which is a region at a distance ranging from 0 to 0.15 t of a thickness (t) of the light-scattering layer from the base substrate and is in contact with the base substrate to exhibit an interface effect, a second surface region, which is a region at a distance ranging from 0 to 0.1 t of the thickness (t) of the light-scattering layer from the planarization layer and is in contact with the planarization layer to exhibit an interface effect, and an inner layer region, which is a region at a distance ranging from 0. It to 0.85 t from the planarization layer (a region at a distance ranging from 0.15 t to 0.9 t of the thickness (t) of the light-scattering layer from the base substrate), is located between the first surface region and the second surface region and has no interface effect, a degree of uniformity of element-specific intensity (the number of elements) may be 85% or higher, in an embodiment.

degree of uniformity=(a larger value of differences between the maximum value and minimum value and the average value of element-specific intensity at each depth in the inner layer region/ average value)

TABLE 1

| Kinds of element | Degree of uniformity in light-scattering layer | Degree of uniformity in planarization layer |
| --- | --- | --- |
| Carbon C | 91.7% | 97% (planarization layer) |
| Titanium Ti | 89.7% | 94.4% (planarization layer) |

Comparing the degree of uniformity of each element in the planarization layer, it can be seen that each element is uniformly infiltrated in the light-scattering layer.

Test 1

Figure 9:
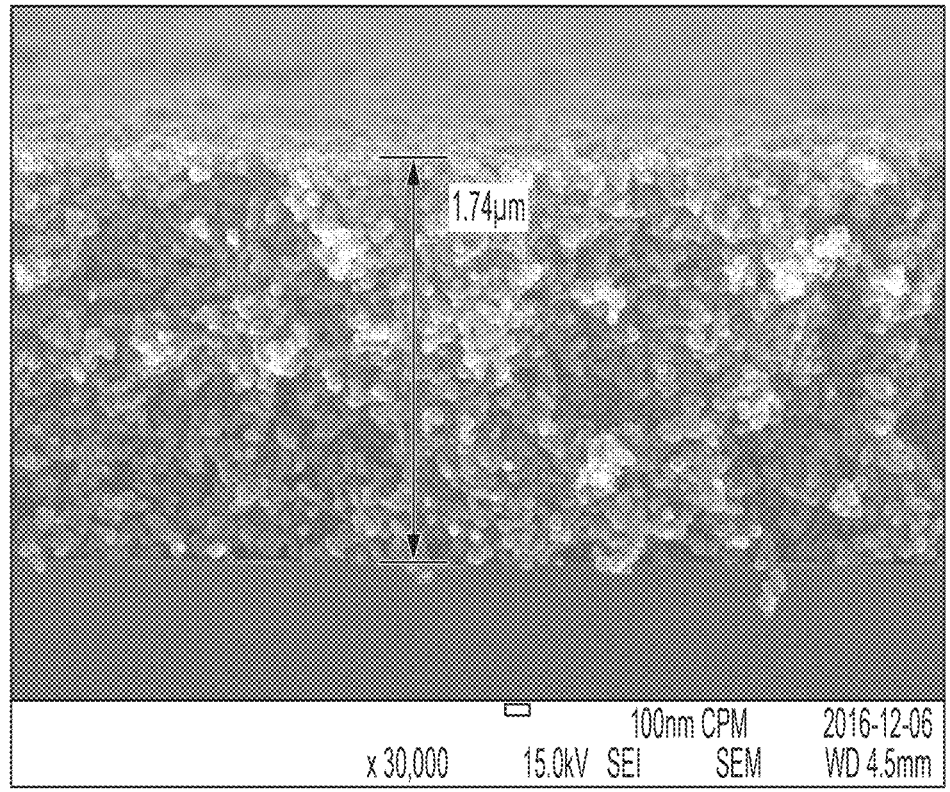
FIG. 9 is a cross-sectional image of the light-scattering layer in Comparative Example 1.
Figure 10:
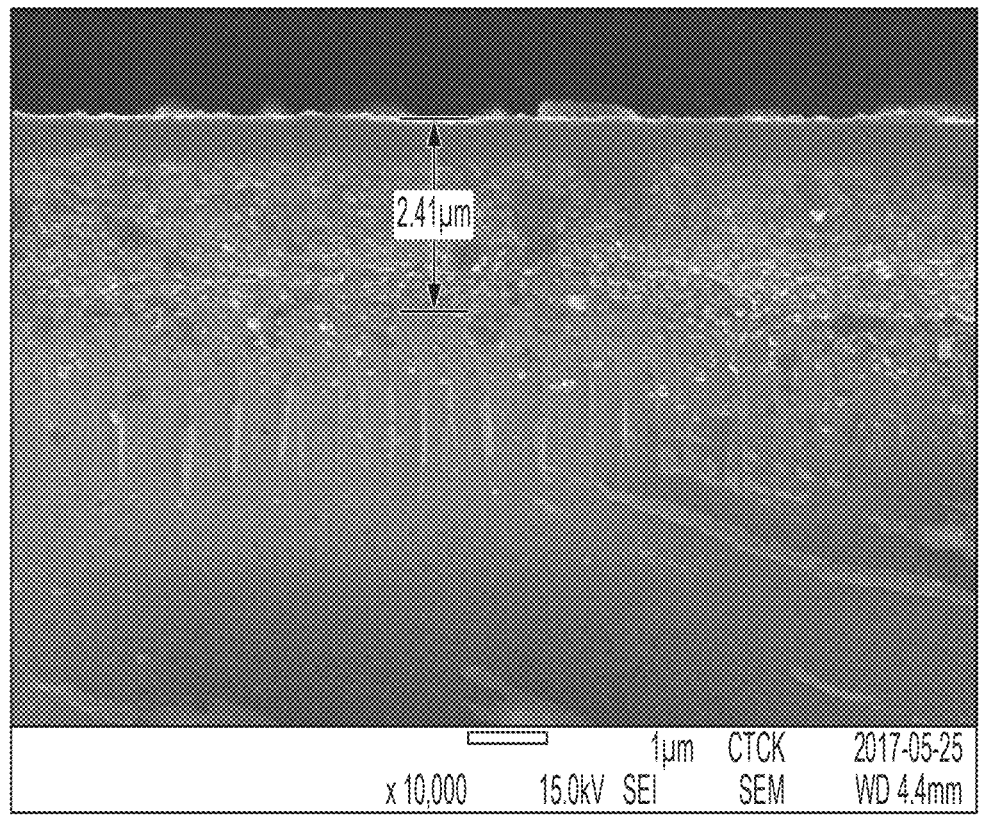
FIG. 10 is a cross-sectional image of the light-scattering layer in Comparative Example 2.

The rutile TiO$_2$ dispersion solution was coated and dried, so that the light-scattering layer as shown in FIG. 9 was formed. At this time, since the second coating solution was not applied yet, all holes were empty (Comparative Example 1).

When the hybrimer having siloxane and TiO$_2$ linked to each other was coated and dried on the porous light-scattering layer having a plurality of holes formed therein, the structure where only the first scattering structures are formed in the light-scattering layer was obtained (Comparative Example 2).

Figure 11:
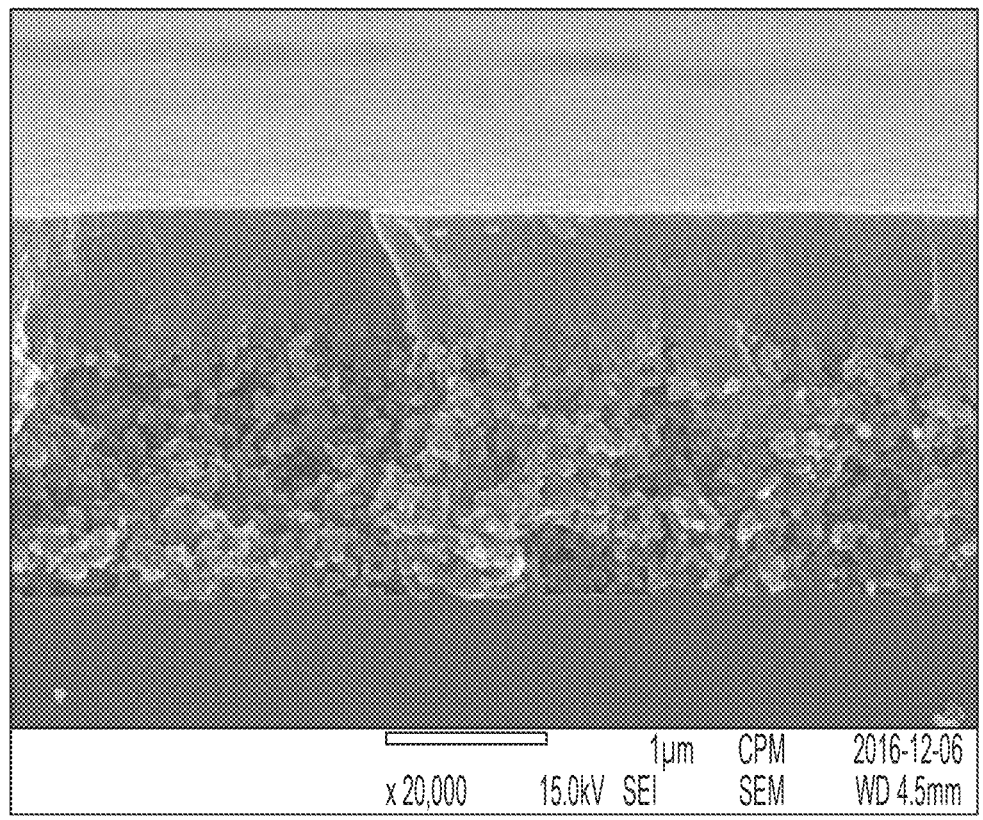
FIG. 11 is a cross-sectional image of a light-scattering layer in accordance with an embodiment of the present disclosure.

By changing the conditions, it is possible to obtain the structure as shown in FIG. 11 where the first scattering structures and the second scattering structures are mixed in the light-scattering layer (an embodiment of the present disclosure)

The organic light-emitting devices having the light extraction layers of the respective structures were manufactured, and following results were obtained.

TABLE 2

| | light extraction efficiency (lm/W, 3000 nit) | Remarks |
| --- | --- | --- |
| Reference | 1.0 | light extraction layer is not applied |
| Comparative Example 1: Structure where the holes in the light-scattering layer are empty (structure where there are no first scattering structures and second scattering structures) | Cannot manufactured | Vapor deposition failure of electrode layer |
| Comparative Example 2: Structure where only the first scattering structures are formed in the light-scattering layer | 1.3 times | |
| Embodiment of the present disclosure: Structure where the first scattering structures and the second scattering structures are mixed in the light-scattering layer | 1.9 times to 2.3 times | |

Test 2

The light-scattering layer was formed to have a thickness (thickness after drying) of 0.9 μm or greater, and the hybrimer having solid contents of 40 wt % or less was coated on the light-scattering layer, so that the light extraction layer, in which the first scattering structures and the second scattering structures were mixed, could be obtained. The thickness (thickness after drying) of the planarization layer was 0.5 μm to 1.5 μm.

Test 3

Figure 12:
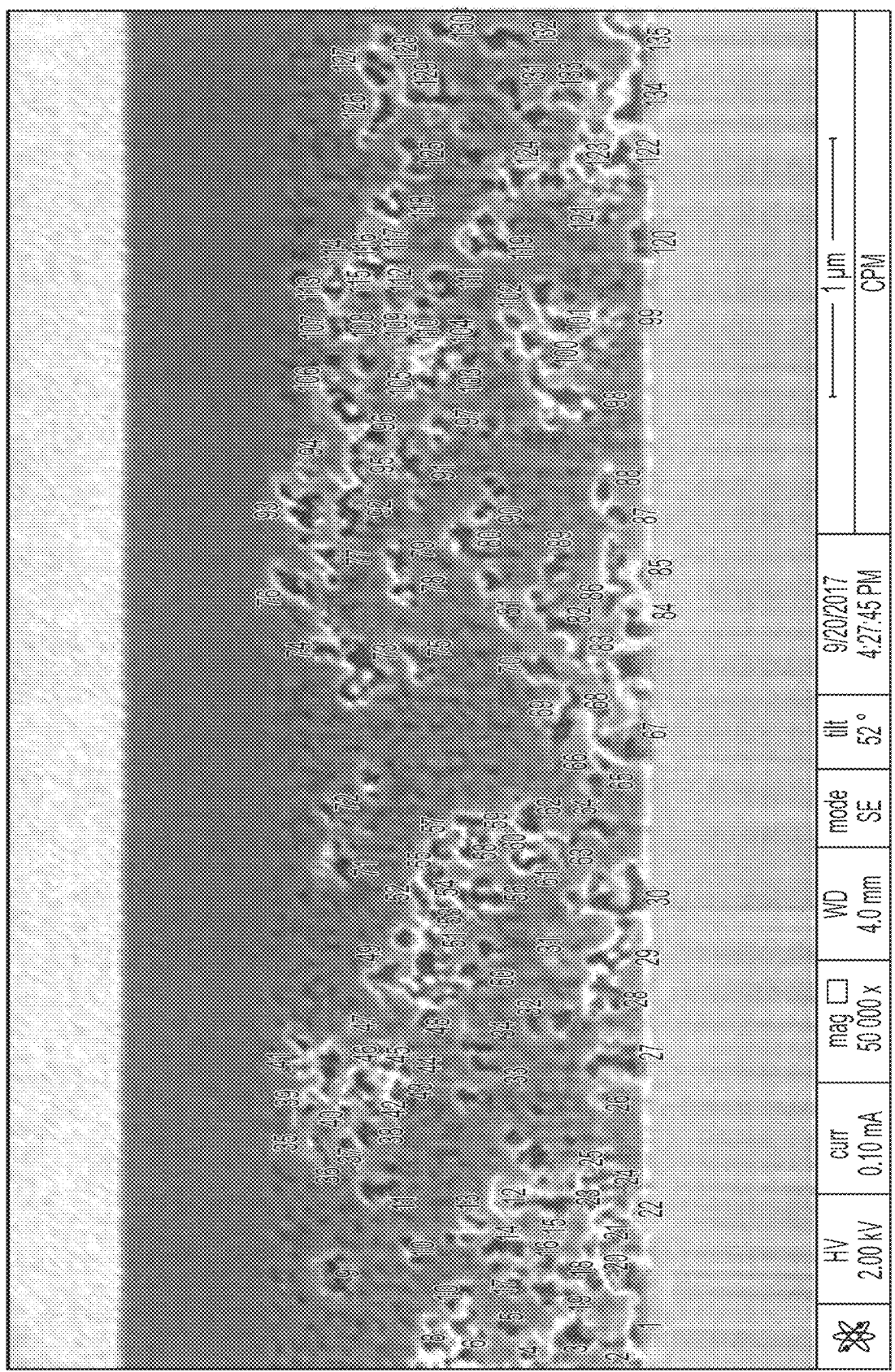
FIGS. 12 and 13 are cross-sectional images of light-scattering layers in accordance with embodiments of the present disclosure.
Figure 13:
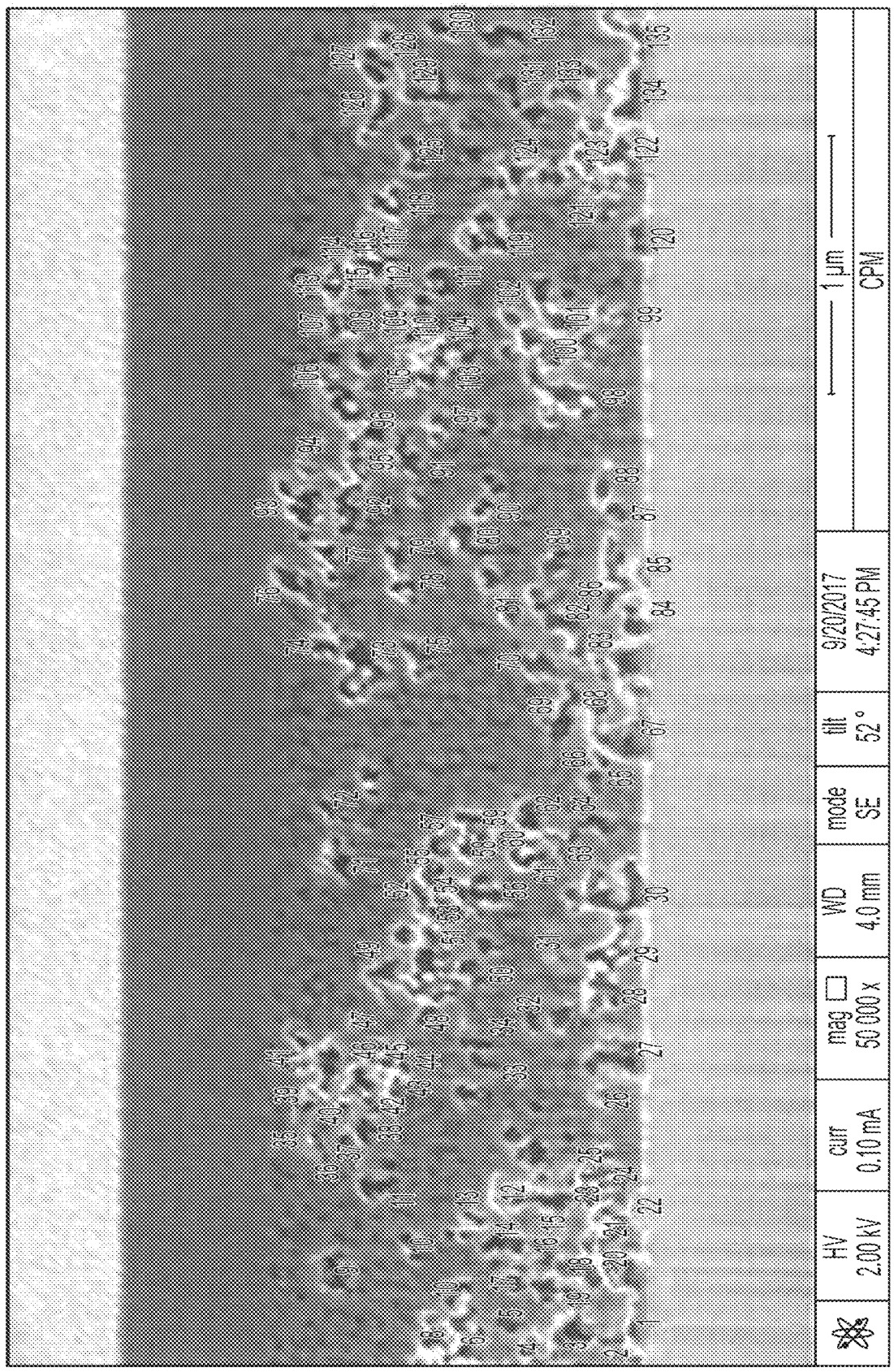

FIGS. 12 and 13 are cross-sectional images of the light-scattering layers.

In the light-scattering layer of FIG. 12, the number of voids having the longest-to-shortest length ratio of 1.5 times or greater was 135 voids, and the number of voids having the longest-to-shortest length ratio less than 1.5 times was 70 voids, so that the ratio of the voids having the longest-to-shortest length ratio of 1.5 times or greater was 65.9% of the total number of voids.

In the light-scattering layer of FIG. 13, the number of voids having the longest-to-shortest length ratio of 1.5 times or greater was 107 voids, and the number of voids having the longest-to-shortest length ratio less than 1.5 times was 43 voids, so that the ratio of the voids having the longest-to-shortest length ratio of 1.5 times or greater was 71.3% of the total number of voids.

The foregoing description of the embodiments of the present disclosure has been provided for the purposes of illustration and description. It is not intended to be exhaustive or to limit the present disclosure to the precise forms disclosed. Obviously, many modifications and variations will be apparent to one skilled in the art. The embodiments were chosen and described in order to best explain the principles of the present disclosure and its practical applications, thereby enabling others skilled in the art to understand the present disclosure for various embodiments and with the various modifications as are suited to the particular use contemplated. It is intended that the scope of the present disclosure be defined by the following claims and their equivalents.

What is claimed is:

1. A light extraction substrate of an organic light-emitting device, the light extraction substrate comprising:
 a base substrate;
 a porous light-scattering layer formed on the base substrate, comprising a first material, and having a plurality of holes formed therein;
 a planarization layer formed on the light-scattering layer, and comprising a second material; and
 a plurality of scattering structures comprising the second material, the plurality of scattering structures formed by the second material infiltrated from the planarization layer into the light-scattering layer such that the second material of the plurality of scattering structures fills at least 5% of a total volume of the plurality of holes,
 wherein at least a part of the plurality of scattering structures has voids formed therein, and wherein the light-scattering layer comprises localized sites, each of the localized sites having a refractive index n expressed by the formula:

$$1 < n < (1-x)*n1 + x*n2,$$

wherein n1 is a refractive index of the first material, where n1>1, n2 is a refractive index of the second material, where n1>n2>1, 1 is a refractive index of air, and x is a ratio of a volume of the second material filling the holes in the localized sites with respect to a volume of the holes in the localized sites, where 0<x<1.

2. The light extraction substrate according to claim 1, wherein the plurality of scattering structures are formed such that the second material of the plurality of scattering structures fills 75% or less of the total volume of the plurality of holes.

3. The light extraction substrate according to claim 1, wherein the first material comprises a metal oxide.

4. The light extraction substrate according to claim 3, wherein the metal oxide comprises $TiO_2$.

5. The light extraction substrate according to claim 4, wherein the $TiO_2$ has a dendritic crystal habit.

6. The light extraction substrate according to claim 1, wherein the second material comprises an organic-inorganic hybrimer.

7. The light extraction substrate according to claim 1, wherein, on a cross-section of the light-scattering layer taken in a thickness direction, a total area of all the holes is at least 50% of an area of the light-scattering layer.

8. The light extraction substrate according to claim 1, wherein, on a cross-section of the light-scattering layer taken in a thickness direction, a total area of all the voids ranges from 1% to 20% of an area of the light-scattering layer.

9. The light extraction substrate according to claim 1, wherein, on a cross-section of the light-scattering layer taken in a thickness direction, the number of voids having a longest-to-shortest length ratio exceeding 1.5 is 50% or more of a total number of the voids.

10. The light extraction substrate according to claim 1, wherein a refractive index of the second material with respect to 633 nm light is 1.6 or higher.

11. The light extraction substrate according to claim 1, wherein, in a region at a distance ranging from 0.1 t to 0.85 t of a thickness (t) of the light-scattering layer from the planarization layer, a degree of uniformity of element-specific intensity is at least 85%.

12. A method of manufacturing a light extraction substrate of an organic light-emitting device, the method comprising:
 forming a light-scattering layer on a base substrate, the light-scattering layer comprising a first material and having a plurality of holes formed therein;
 forming a planarization layer on the light-scattering layer, the planarization layer comprising a second material, and
 forming a plurality of scattering structures comprising the second material by allowing the second material to infiltrate from the planarization layer into the light-scattering layer such that the second material of the plurality of scattering structures fills at least 5% of a total volume of the plurality of holes, and
 wherein at least a part of the plurality of scattering structures has voids formed therein.

* * * * *